United States Patent [19]

Chung et al.

[11] Patent Number: 4,837,748
[45] Date of Patent: Jun. 6, 1989

[54] COUNTING RAM

[75] Inventors: Shine C. Chung; Siu K. Tsang, both of San Jose; James T. Koo, Los Altos Hills; Sho Long S. Chen, Palo Alto; John Y. Chan, San Carlos, all of Calif.

[73] Assignee: Vitelic Corporation, San Jose, Calif.

[21] Appl. No.: 38,107

[22] Filed: Apr. 14, 1987

Related U.S. Application Data

[63] Continuation-in-part of Ser. No. 930,592, Nov. 13, 1986, abandoned.

[51] Int. Cl.⁴ ............................................. G11C 8/00
[52] U.S. Cl. .................................. 365/236; 377/51; 365/78
[58] Field of Search ............... 365/189, 77, 78, 239, 365/240, 236; 377/28, 51

[56] References Cited

U.S. PATENT DOCUMENTS 3,832,640  8/1974  Cederquist et al. .................. 377/51
4,393,482  7/1983  Yamada ........................... 365/78 X Primary Examiner—Joseph A. Popek
Attorney, Agent, or Firm—Townsend and Townsend

[57] ABSTRACT

An integrated circuit memory with additional circuitry added so that the integrated circuit acts as a counting memory is disclosed. A memory core is included with associated circuitry allowing it to be accessed in the same manner as ordinary random access memory (RAM). A counter is included and is coupled so that it can receive the contents of any location in the memory core. Each address in the memory acts as an individual counter. When a particular memory address is presented indicating that the count at that memory location should be incremented, the contents of that memory location are transferred to the counter, the counter is incremented, and the contents of the counter are then transferred back to the memory location. This process is repeated each time a new address is presented indicating a new event to be recorded. At the end of a series of events, the core memory will contain, at each corresponding memory location, the number of occurrences of the event assigned to that address.

9 Claims, 3 Drawing Sheets

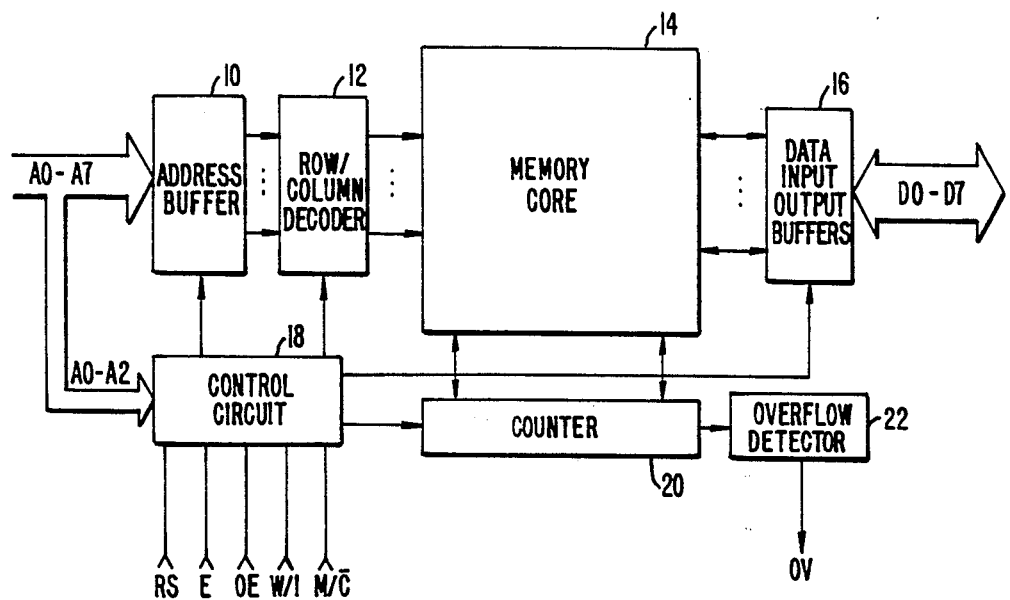
FIG._1.
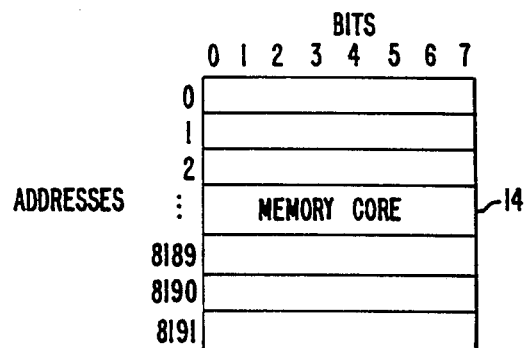
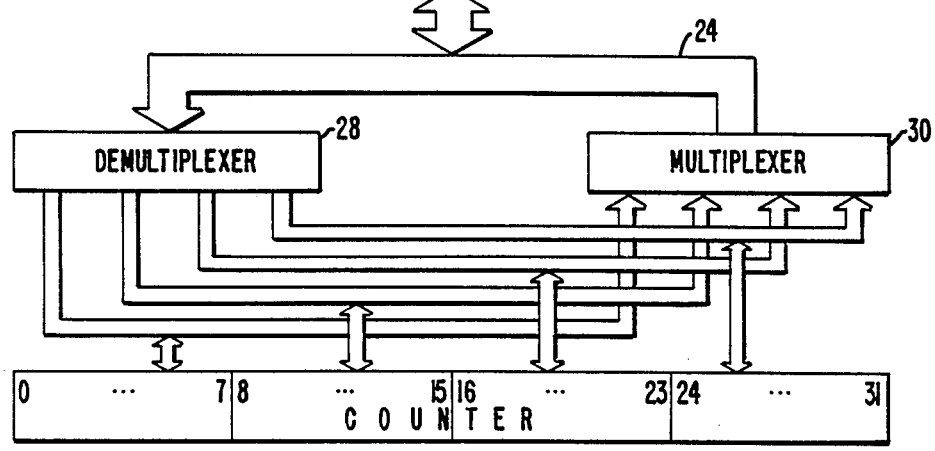
FIG._2.

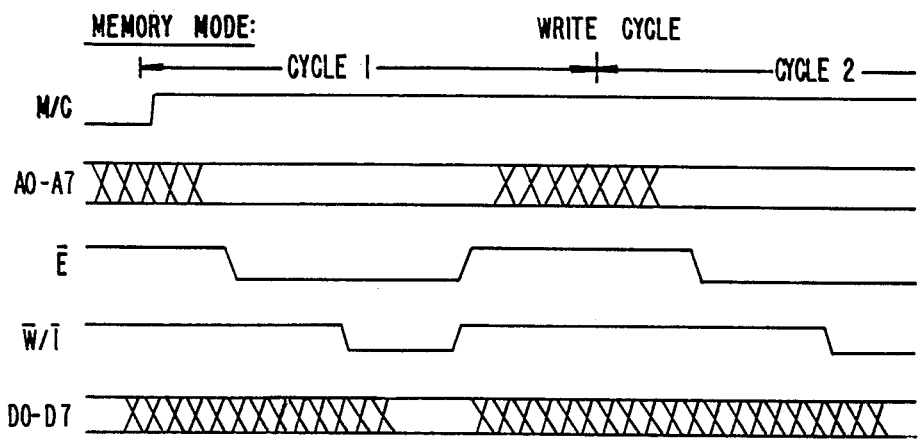
FIG._3.
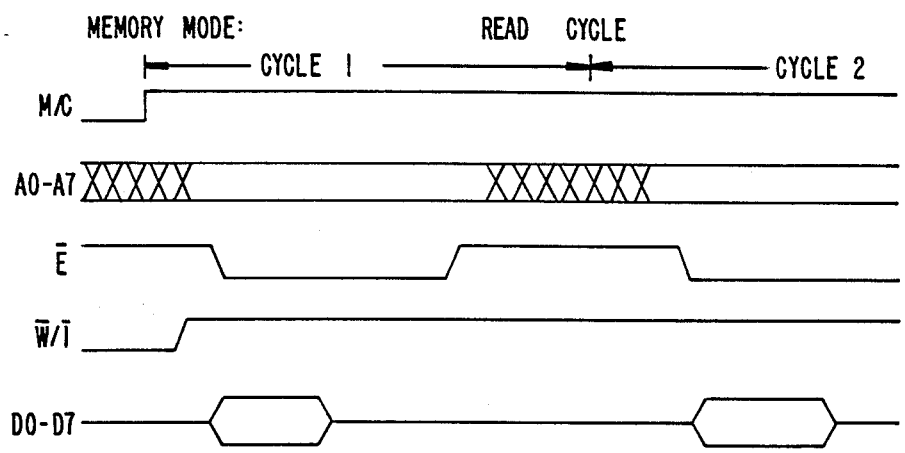
FIG._5.

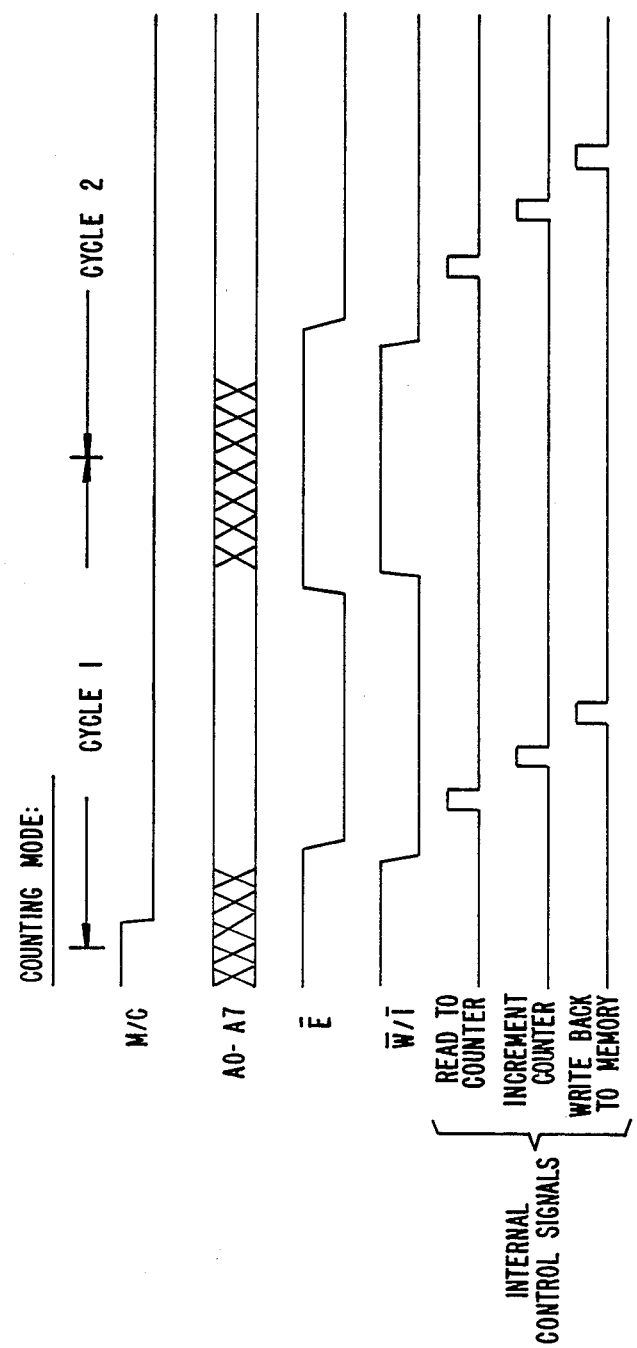
FIG._4.

COUNTING RAM

BACKGROUND

This application is a continuation-in-part of application Ser. No. 930,592, filed Nov. 13, 1986, now abandoned.

The present invention relates to circuits for counting a plurality of events in real time.

There are a number of applications where separate counts need to be maintained for different events. These applications include histogramming functions for inspection systems to determine the relative frequency of particular flaws, error counters in memory systems to point to frequently failing memory boards, histogramming functions in data handling systems where it is desired to compress the apparent volume of data for storage and sampling devices to determine the frequency distribution of events. Other applications include radar scan detection, wave spectrum analysis and image and wave detection or recognition.

Typically in the prior art, such counts are maintained by using a number of different counters, with each individual counter being assigned to a particular event in the series of events being monitored. Each time that event occurs, a signal is sent to the identified counter to increment it. After the series of events has been monitored, all of the counters can be read to produce the data indicating the frequency of the various events.

Unfortunately, such a system can be quite cumbersome and complicated and can require a large number of counters where a large number of events is desired to be monitored.

SUMMARY OF THE INVENTION

The present invention is an integrated circuit memory with additional circuitry added so that the integrated circuit acts as a counting memory. A memory core is included with associated circuitry allowing it to be accessed in the same manner as ordinary random access memory (RAM). A counter is included and is coupled so that it can receive the contents of any location in the memory core. Each address in the memory acts as an individual counter. When a particular memory address is presented indicating that the count at that memory location should be incremented, the contents of that memory location are transferred to the counter, the counter is incremented, and the contents of the counter are then transferred back to the memory location. This process is repeated each time a new address is presented indicating a new event to be recorded. At the end of a series of events, the core memory will contain, at each corresponding memory location, the number of occurrences of the event assigned to that address.

The circuit of the present invention can operate in a counting mode or in a memory mode. In the memory mode, the counter is bypassed and the circuit acts as an ordinary RAM. While in the memory mode, the RAM can be read, reset, or written into with a starting count for each location. In the counting mode, the contents of each location are incremented each time that location is addressed. In the event that the count at any particular address overflows the capacity of the counter, an overflow signal will be generated. Alternately, instead of incrementing the counter each time an event occurs, the memory can be preset to a maximum value with the memory contents at each address being decremented in the counter upon the occurrence of an event. In this configuration, an underflow signal will be generated if the count passes zero.

The RAM is preferably an 8K word by 8 bit static RAM. The circuit can be reconfigured to expand the word size from 8 bits to 16 bits, 24 bits or 32 bits. The counter size is 32 bits, and in the 8 bit configuration, only the first 8 bits of the counter are used. In a 16 bit configuration, two adjacent address locations act as a single address and their contents are loaded into the first and second 8 bits of the counter, respectively, upon the addressing of the first address location. The total count maintained thus extends over two address locations. Similarly, this can be extended to 24 and 32 bits by combining three and four address locations, respectively.

The present invention thus provides the capability to monitor a large number of events in real time using a single integrated circuit chip. For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram of a counting RAM according to the present invention;

FIG. 2 is a block diagram of a portion of a counting RAM according to the present invention showing the elements used for reconfiguration; and FIGS. 3, 4 and 5 are timing diagrams of the memory mode write cycle, the counting mode, and the memory mode read cycle, respectively.

DETAILED DESCRIPTION OF THE PREFERRED EMBODIMENT

FIG. 1 is a block diagram of an embodiment of a counting RAM according to the present invention. Address lines A0–A7 are provided through an address buffer 10 and a row/column decoder 12 to a memory core 14. Data bits D0–D7 are provided to and from memory core 14 through data input/output buffers 16. A control circuit 18 controls the operation of the counting RAM including the transfer of data from memory core 14 to a counter 20, the incrementing or decrementing of counter 20 and the return of data from counter 20 to memory core 14. An overflow detector 22 is provided which will present an overflow signal OV when counter 20 overflows. Memory core 14 is an 8K word×8 bit static RAM. Counter 20 is a 32 bit counter. The configuration of the memory is controlled by address bits A0–A2 prior to the operation of the circuit. Addresses A0–A2 are provided to control circuit 18 for this purpose. Depending on the value of these address bits, the memory is configured either as an 8K×8 RAM, 4K×16, 3K×24, or 2K×32.

The other external control signals provided to control circuit 18 are as follows:

$\overline{RS}$—reset—resets the memory core contents to zero (increment mode) or one (decrement mode).

$\overline{E}$—chip enable—selects the chip.

OE—output enable—enables the data output lines.

M/C—mode select—selects either the memory mode or the counter mode of operation.

$\overline{W/I}$—read/write or increment/decrement—this signal selects either a read or write cycle when the circuit is in the memory mode and selects either an increment or decrement count when in the counting mode.

FIG. 3 shows a timing diagram for a write cycle in the memory mode. This enables the circuit to act as an ordinary memory or to allow a predetermined base count to be loaded into the memory core. As can be seen from FIG. 3, the write cycle timing is a typical RAM timing diagram with the addition of the control signal M/C which must go high to select the memory mode. This effectively removes counter 20 from the circuit and allows the circuit to act as a pure memory. After addresses A0-A7 are selected, the enable signal $\overline{\text{E}}$ is activated and then write signal $\overline{\text{W}}/\text{I}$ is selected, after which data signals D0-D7 are presented to the memory core. A read cycle is shown in FIG. 5. The same data pins are used for the read and write cycles. In the read cycle, the data pins assume a high impedance state when no valid data is present. Not shown is a reset cycle for presetting the memory contents. This is done in the same manner as for an ordinary memory.

In the counting mode, the mode select signal M/C is low as shown in FIG. 4. After addresses A0-A7 are selected, the increment/decrement signal $\overline{\text{W}}/\text{I}$ goes low and then the enable signal E goes low. This instructs the counter 20 to increment whatever data is provided to it. Internally to the circuit, the addressed memory location is first read to counter 20, then a separate control signal causes counter 20 to increment by one, and then a final control signal causes the contents of counter 20 to be written back to the addressed memory location. After a count of a series of events is concluded, a read can be done in the memory mode to output the results.

FIG. 2 shows additional circuitry which can be added to the embodiment of FIG. 1 to allow reconfiguration of the memory. Memory core 14 is coupled to a data bus 24. A demultiplexer 28 and a multiplexer 30 are coupled to data bus 24 to provide a capability for reconfiguration. If the circuit is to be reconfigured from an 8K word×8 bit RAM to a 2K×32 bit RAM, demultiplexer 28 will provide the contents of each of four successive addresses to the first quarter, second quarter, third quarter and fourth quarter of counter 20, respectively. Thus, when an address zero is indicated, this will refer to the contents of addresses 0-3 which will be loaded in succession into counter 20 before counter 20 is incremented. Thereafter, the contents of each quarter of counter 20 will return to their respective memory locations through multiplexer 30. Similarly, the circuit can be reconfigured to have 16 bits or 24 bits. In the case of 8 bits, 16 bits or 24 bits, the overflow detector 22 of FIG. 1 will receive its signal from the 8th bit, 16th bit or 24th bit, respectively, of counter 20.

In operation, the circuit is first configured in response to addresses A0-A2 and a low level on reset signal $\overline{\text{RS}}$. Thereafter, counting will occur when the counting mode is selected and an enable signal is provided along with an address corresponding to the event to be counted for each occurrence of that event. After a series of events is counted, the count can be read out by switching the circuit to the memory mode and performing a read operation.

As will be understood by those familiar with the art, the present invention may be embodied in other specific forms without departing from the spirit or essential characteristics thereof. For example, the demultiplexer and multiplexer used for reconfiguration could be eliminated by using a serially loaded counter and simply loading and unloading the contents of a number of succeeding memory locations. Accordingly, the disclosure of the preferred embodiment of the invention if intended to be illustrative, but not limiting, of the scope of the invention which is set forth in the following claims.

What is claimed is:

1. An integrated electronic circuit comprising:
    a memory having a plurality of addressable locations;
    a counter;
    control means for first providing the contents of an addressed one of said memory locations to said counter as the count of said counter, second, directing said counter to change said count, and third, returning said changed count to said memory location.

2. The circuit of claim 1 further comprising an overflow detector for detecting an overflow of said counter and providing an output overflow signal.

3. The circuit of claim 1 wherein said counter holds at least twice as many bits as each said memory location and further comprising:
    demultiplexing means for providing the contents of at least first and second succeeding memory locations to first and second portions of said counter; and
    multiplexing means for providing the contents of said first portion of said counter to said first memory location and said second portion of said counter to said second memory location.

4. The circuit of claim 1 wherein said control means includes means, responsive to a first control signal, for disabling said counter so that said circuit functions solely as a memory.

5. The circuit of claim 1 wherein said control means includes means for incrementing said count of said counter responsive to a first state of a control signal and decrementing said count of said counter responsive to a second state of said control signal.

6. An integrated electronic circuit comprising:
    a memory having a plurality of addressable locations;
    a counter, said counter holding at least twice as many bits as each said memory location;
    control means for first, providing the contents of an addressed one of said memory locations to said counter as the count of said counter, second, directing said counter to change said count, and third, returning said changed count to said memory location, said control means including means, responsive to a first control signal, for disabling said counter so that said circuit functions solely as a memory;
    an overflow detector for detecting an overflow of said counter and providing an overflow signal;
    demultiplexing means for providing the contents of at least first and second succeeding memory locations to first and second portions of said counter; and
    multiplexing means for providing the contents of said first portion of said counter to said first memory location and said second portion of said counter to said second memory location.

7. A method for maintaining a count of each occurrence of an event in a series of events using a random access memory and a counter, comprising the steps of:
    first, addressing a memory location corresponding to an event;
    second, transferring the contents of said memory location to said counter;
    third, changing the count of the contents of said counter; and
    fourth, transferring the contents of said counter back to said memory location.

8. The method of claim 7 further comprising the step of detecting an overflow of said counter.

9. The method of claim 7 wherein said counter holds at least twice as many bits as each memory location and further comprising the steps of transferring the contents of at least two succeeding memory locations to said counter prior to changing the contents of said counter and transferring the changed contents of a first and second portion of said counter to said succeeding address locations.

* * * * *